United States Patent
Shin

(10) Patent No.: US 9,530,471 B1
(45) Date of Patent: Dec. 27, 2016

(54) SEMICONDUCTOR MEMORY APPARATUS

(71) Applicant: SK hynix Inc., Icheon-si Gyeonggi-do (KR)

(72) Inventor: Sun Hye Shin, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/921,012

(22) Filed: Oct. 23, 2015

(30) Foreign Application Priority Data

Jun. 19, 2015 (KR) ........................ 10-2015-0087584

(51) Int. Cl.
*G11C 8/08* (2006.01)
*G11C 7/22* (2006.01)
*G11C 7/12* (2006.01)
*G11C 8/10* (2006.01)

(52) U.S. Cl.
CPC . *G11C 7/22* (2013.01); *G11C 7/12* (2013.01); *G11C 8/08* (2013.01); *G11C 8/10* (2013.01)

(58) Field of Classification Search
CPC ....................................................... G11C 8/08
USPC ..................................................... 365/230.06
See application file for complete search history.

(56) References Cited

U.S. PATENT DOCUMENTS

| | | | | |
|---|---|---|---|---|
| 5,982,701 A * | 11/1999 | Eto | ................... | G11C 8/12 365/189.09 |
| 6,141,262 A * | 10/2000 | Sudo | ................... | G11C 16/08 365/189.09 |
| 7,113,027 B2 * | 9/2006 | Yamazaki | ................. | G11C 5/14 327/540 |
| 7,254,081 B2 * | 8/2007 | Sugawara | ................ | G11C 8/08 365/226 |
| 7,277,315 B2 * | 10/2007 | Yuan | ..................... | G11C 5/145 365/149 |
| 7,606,109 B2 * | 10/2009 | Im | ..................... | G11C 8/08 365/189.11 |
| 7,626,862 B2 * | 12/2009 | Matsubara | ............... | G11C 8/14 365/185.13 |
| 8,629,575 B2 * | 1/2014 | Roth | ..................... | G11C 8/08 307/75 |
| 2005/0201186 A1 * | 9/2005 | Yamazaki | ................ | G11C 5/14 365/230.06 |
| 2006/0104131 A1 * | 5/2006 | Sugawara | ................ | G11C 8/08 365/189.09 |
| 2007/0133317 A1 * | 6/2007 | Yuan | ..................... | G11C 5/145 365/189.09 |
| 2009/0116304 A1 | 5/2009 | Kim et al. | | |

FOREIGN PATENT DOCUMENTS

KR 1020120053263 A 5/2012

* cited by examiner

*Primary Examiner* — Son Mai
(74) *Attorney, Agent, or Firm* — William Park & Associates Ltd.

(57) ABSTRACT

A semiconductor memory apparatus may include a driving voltage-applying unit and a sub-word line-driving unit. The driving voltage-applying unit may be configured to generate a driving voltage in response to an active signal, a word line-enabling signal and a sub-word line selection signal. The sub-word line-driving unit may be configured to drive a sub-word line as a voltage level of the driving voltage in response to a main word line and the sub-word line selection signal.

25 Claims, 7 Drawing Sheets

SEMICONDUCTOR MEMORY APPARATUS

CROSS-REFERENCES TO RELATED APPLICATION

The present application claims priority under 35 U.S.C. §119(a) to Korean application number 10-2015-0087584, filed on Jun. 19, 2015 in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

Semiconductor memory apparatuses are being developed, continuously, to try and provide the semiconductor memory apparatuses with smaller sizes, higher speeds, and lower power consumption, etc.

Semiconductor memory apparatuses having the smaller sizes may have a higher integration degree, and thus an area of a memory cell in the semiconductor memory apparatus may be reduced. Thus, an area and a capacity of a capacitor within the memory cell may also be decreased.

As a result, voltage levels of data may be lowered, but, as a result, sensing margins of the data may not be sufficiently ensured.

SUMMARY

According to various examples of the embodiments, there may be provided a semiconductor memory apparatus. The semiconductor memory apparatus may include a driving voltage-applying unit and a sub-word line-driving unit. The driving voltage-applying unit may be configured to generate a driving voltage in response to an active signal, a word line-enabling signal and a sub-word line selection signal. The sub-word line-driving unit may be configured to drive a sub-word line as a voltage level of the driving voltage in response to a main word line and the sub-word line selection signal.

According to various examples of the embodiments, there may be provided a semiconductor memory apparatus. The semiconductor memory apparatus may include a command-decoding unit, a word line-enabling signal-generating unit, an address-decoding unit, a driving voltage-applying unit, a sub-word line-driving unit, a memory region and a sense amplifier. The command-decoding unit may be configured to generate an active signal in response to a command. The word line-enabling signal-generating unit may be configured to generate a word line-enabling signal in response to the active signal. The address-decoding unit may be configured to decode an address for an enabled section of the word line-enabling signal to generate a main word line and a sub-word line selection signal. The driving voltage-applying unit may be configured to generate a driving voltage in response to the active signal, the word line-enabling signal and the sub-word line selection signal. The sub-word line-driving unit may be configured to drive a sub-word line as a voltage level of the driving voltage in response to a main word line and the sub-word line selection signal. The memory region may be configured to transmit data to a bit line or receive data from the bit line in response to the sub-word line selection signal. The sense amplifier may be configured to sense and amplify the data of the bit line.

According to various examples of the embodiments, there may be provided a semiconductor memory apparatus. The semiconductor memory apparatus may be configured to include a sub-word line-driving unit and a driving voltage-applying unit. The sub-word line-driving unit may be configured to drive a sub-word line as a voltage level of a driving voltage for enabled sections of a main word line and a sub-word line selection signal. The driving voltage-applying unit may be configured to output the driving voltage having a voltage level of a second pumping voltage higher than a first pumping voltage at an enable timing of a word line-enabling signal and a disable timing of an active signal.

According to various examples of the embodiments, there may be provided a semiconductor memory apparatus. The semiconductor memory apparatus may include a driving voltage-applying unit and a sub-word line-driving unit. The driving voltage-applying unit may be configured to generate either a first pumping voltage, a second pumping voltage, or ground voltage as a driving voltage. The sub-word line-driving unit may be configured to drive a sub-word line by a voltage level of the driving voltage in response to a main word line and a sub-word line selection signal.

DETAILED DESCRIPTION

Figure 1:
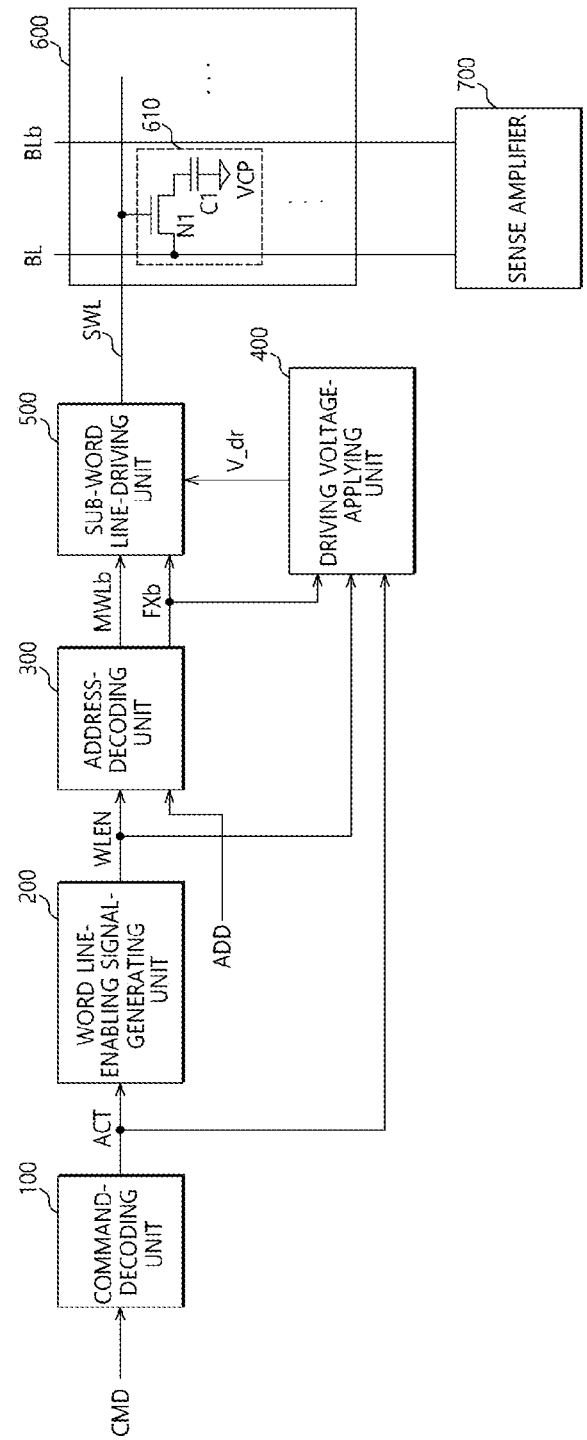
FIG. 1 is a block diagram illustrating a representation of an example of a semiconductor memory apparatus in accordance with various examples of embodiments.

Various examples of the embodiments will be described more fully hereinafter with reference to the accompanying drawings, in which some examples of the embodiments are illustrated. The embodiments may, however, be embodied in many different forms and should not be construed as limited to the examples of the embodiments set forth herein. Rather, these examples of the embodiments are provided so that this disclosure will be thorough and complete, and will fully convey the scope of the disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terminology used herein is for the purpose of describing particular examples of the embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various examples of the embodiments are described herein with reference to cross-sectional illustrations that are schematic illustrations of idealized examples of the embodiments (and intermediate structures). As such, variations from the shapes of the illustrations as a result, for example, of manufacturing techniques and/or tolerances, are to be expected. Thus, examples of the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, various examples of the embodiments will be explained in below with reference to the accompanying drawings.

FIG. 1 is a block diagram illustrating a representation of an example of a semiconductor memory apparatus in accordance with various examples of embodiments.

Referring to FIG. 1, in an embodiment, a semiconductor memory apparatus may include a command-decoding unit 100, a word line-enabling signal-generating unit 200, an address-decoding unit 300, a driving voltage-applying unit 400, a sub-word line-driving unit 500, a memory region 600 and a sense amplifier 700.

The command-decoding unit 100 may generate an active signal ACT in response to a command CMD. For example, when the command CMD includes an active command, the command-decoding unit 100 may enable the active signal ACT. For example, when the command CMD includes a pre-charge command, the command-decoding unit 100 may disable the active signal ACT.

The word line-enabling signal-generating unit 200 may generate a word line-enabling signal WLEN in response to the active signal ACT. For example, when the active signal ACT is enabled, the word line-enabling signal-generating unit 200 may enable the word line-enabling signal WLEN. For example, when the active signal ACT disabled, the word line-enabling signal-generating unit 200 may disable the word line-enabling signal WLEN.

The address-decoding unit 300 may decode an address ADD for an enabled section of the word line-enabling signal WLEN to generate a main word line MWLb and a sub-word line selection signal FXb. For example, the address-decoding unit 300 may decode the address ADD for the enabled section of the word line-enabling signal WLEN to generate the main word line MWLb and the sub-word line selection signal FXb as a low level.

The driving voltage-applying unit 400 may generate a driving voltage V_dr in response to the active signal ACT, the word line-enabling signal WLEN and the sub-word line selection signal FXb. For example, the driving voltage-applying unit 400 may determine a voltage level and an output time of the driving voltage V_dr in response to the active signal ACT, the word line-enabling signal WLEN and the sub-word line selection signal FXb.

The sub-word line-driving unit 500 may determine an enablement of a sub-word line SWL in response to the main word line MWLb and the sub-word line selection signal FXb. For example, when the main word line MWLb and the sub-word line selection signal FXb may be enabled, the sub-word line-driving unit 500 may enable the sub-word line SWL as a voltage level of the driving voltage V_dr. For example, when any one of the main word line MWLb and the sub-word line selection signal FXb is disabled, the sub-word line-driving unit 500 may disable the sub-word line SWL.

The memory region 600 may store data. The memory region 600 may include a plurality of memory cells 610. Each of the memory cells 610 may include a first transistor N1 and a first capacitor C1. The first transistor N1 may include a gate connected to the sub-word line SWL, a drain connected to a bit line BL, and a source connected to a first end of the first capacitor C1. The first capacitor C1 may have a second end to which a cell plate voltage VCP may be applied.

The sense amplifier 700 may sense and amplify a voltage between the bit line pair BL and BLb.

Figure 2:
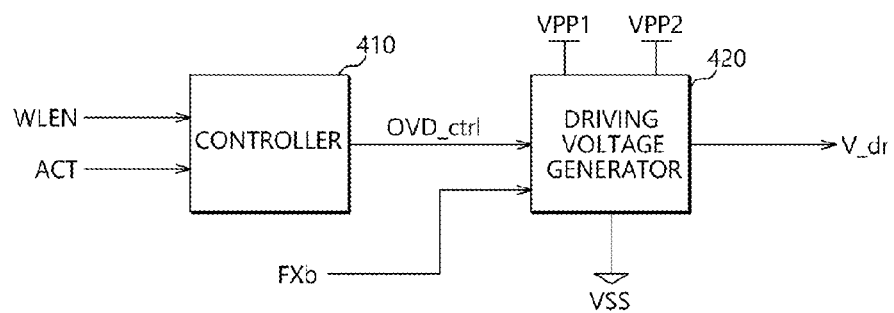
FIG. 2 is a block diagram illustrating a representation of an example of a driving voltage-applying unit in FIG. 1.

FIG. 2 is a block diagram illustrating a representation of an example of a driving voltage-applying unit in FIG. 1.

Referring to FIG. 2, the driving voltage-applying unit 400 may include a controller 410 and a driving voltage generator 420.

The controller 410 may generate an over driving control signal OVD_ctrl in response to the word line-enabling signal WLEN and the active signal ACT. For example, when the word line-enabling signal WLEN is enabled, the controller 410 may enable the over driving control signal OVD_ctrl. For example, when the active signal ACT is disabled, the controller 410 may enable the over driving control signal OVD_ctrl.

The driving voltage generator 420 may determine a voltage level and an output time of the driving voltage V_dr in response to the over driving control signal OVD_ctrl and the sub-word line selection signal FXb. The driving voltage generator 420 may output the driving voltage V_dr at the determined voltage level and output time. For example, the driving voltage generator 420 may output a first pumping voltage VPP1 as the driving voltage V_dr for an enabled section of only the sub-word line selection signal FXb. The driving voltage generator 420 may output a second pumping voltage VPP2 as the driving voltage V_dr for an enabled section of the over driving control signal OVD_ctrl and the sub-word line selection signal FXb. The driving voltage generator 420 may output a ground voltage VSS as the driving voltage V_dr for the enabled section of only the sub-word line selection signal FXb. The driving voltage generator 420 may output the second pumping voltage VPP2 as the driving voltage V_dr for the enabled section of the over driving control signal OVD_ctrl and the sub-word line selection signal FXb. The first pumping voltage VPP1 may have a voltage level different from that of the second pumping voltage VPP2. For example, the voltage level of the second pumping voltage VPP2 may be higher or lower than the voltage level of the first pumping voltage VPP1. Hereinafter, some of the following embodiments, for example, may be illustrated under a condition that the voltage level of the second pumping voltage VPP2 may be higher than the voltage level of the first pumping voltage VPP1. However, the embodiments are not limited in this manner and the second pumping voltage VPP2 may be less than the voltage level of the first pumping voltage VPP1.

Figure 3:
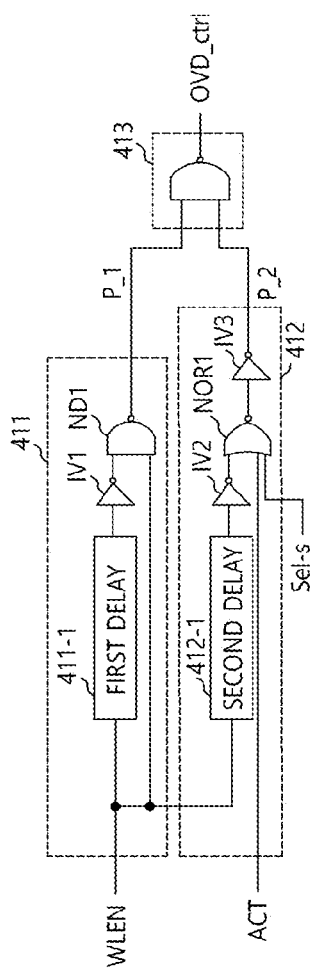
FIG. 3 is a circuit diagram and a timing chart illustrating representations of examples of a controller in FIG. 2.
Figure 3:
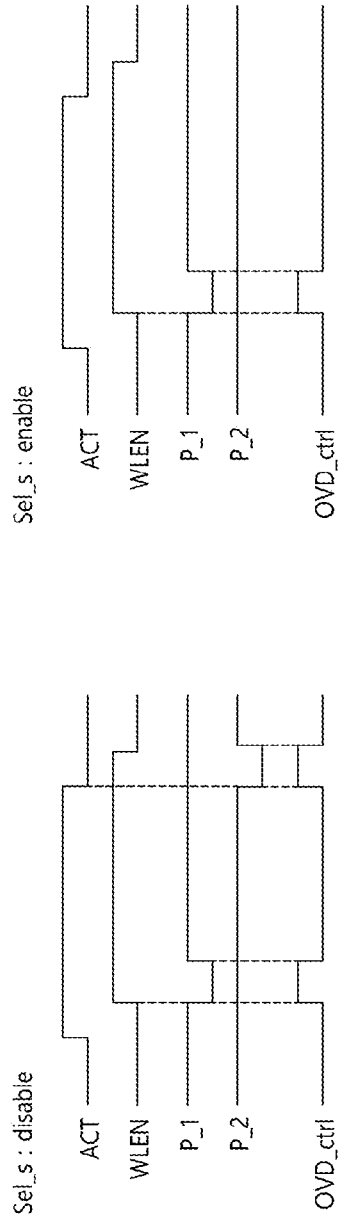

FIG. 3 is a circuit diagram and a timing chart illustrating representations of examples of a controller in FIG. 2.

Referring to FIG. 3, the controller 410 may include a first pulse generator 411, a second pulse generator 412 and a pulse combiner 413.

The first pulse generator 411 may generate a first pulse P_1, which may be enabled for a predetermined time, when the word line-enabling signal WLEN may be enabled. For example, when the word line-enabling signal WLEN may be enabled to a high level, the first pulse generator 411 may generate the first pulse P_1 enabled as a low level for the predetermined time.

The first pulse generator 411 may include a first delay 411-1, a first inverter IV1 and a first NAND gate ND1. The first delay 411-1 may receive the word line-enabling signal WLEN. The first delay 411-1 may delay and output the word line-enabling signal WLEN. The first inverter IV1 may receive an output signal from the first delay 411-1. The first NAND gate ND1 may receive an output signal from the first inverter IV1 and the word line-enabling signal WLEN to output the first pulse P_1.

The second pulse generator 412 may generate a second pulse P_2, which may be enabled for a predetermined time, when the active signal ACT may be disabled. For example, when the active signal ACT is disabled to a low level, the second pulse generator 412 may generate the second pulse P_2 enabled as a low level for the predetermined time. The second pulse generator 412 may determine whether the second pulse P_2 may be generated or not in response to a selection signal Sel_s. For example, when the selection signal Sel_s is disabled, the second pulse generator 412 may generate the second pulse P_2 in response to the active signal ACT. For example, when the selection signal Sel_s is enabled, the second pulse generator 412 may not generate the second pulse P_2. That is, when the selection signal Sel_s is enabled, the second pulse generator 412 may maintain the disabled second pulse P_2 regardless of the active signal ACT.

The second pulse generator 412 may include a second delay 412-1, a second inverter IV2, a third inverter IV3 and a NOR gate NOR1. The second delay 412-1 may receive the word line-enabling signal WLEN. The second delay 412-1 may delay and output the word line-enabling signal WLEN. The second inverter IV2 may receive an output signal from the second delay 412-1. The NOR gate NOR1 may receive an output signal from the second inverter IV2, the active signal ACT and the selection signal Sel_s. The third inverter IV3 may receive an output signal from the NOR gate NOR1 to output the second pulse P_2.

When the first pulse P_1 is inputted into the pulse combiner 413, the pulse combiner 413 may output the first pulse P_1 as the over driving control signal OVD_ctrl. For example, when the second pulse P_2 is inputted into the pulse combiner 413, the pulse combiner 413 may output the second pulse P_2 as the over driving control signal OVD_ctrl. For example, when any one of the first pulse P_1 is inputted into the pulse combiner 413, the pulse combiner 413 may output the inputted pulse as the over driving control signal OVD_ctrl.

When the selection signal Sel_s is disabled to a low level, the first pulse P_1 may be generated in response to the word line-enabling signal WLEN and the second pulse P_2 may be generated in response to the active signal ACT and the word line-enabling signal WLEN. Particularly, when the word line-enabling signal WLEN is enabled to a high level, the first pulse P_1 may be generated as an enable signal having a low level for a predetermined time. When the active signal ACT is disabled to a low level, the second pulse P_2 may be generated as an enable signal having a low level for a predetermined time. The over driving control signal OVD_ctrl may be enabled to a high level for enabled sections of the first pulse P_1 and the second pulse P_2.

Thus, when the selection signal Sel_s is disabled, the over driving control signal OVD_ctrl may have an enabled section substantially the same as the enabled section of the first and second pulses P_1 and P_2.

When the selection signal Sel_s is enabled to a high level, the first pulse P_1 may be generated in response to the word line-enabling signal WLEN and the second pulse P_2 may be fixed to a specific level, for example, a high level regardless of the active signal ACT and the word line-enabling signal WLEN. Particularly, when the word line-enabling signal WLEN is enabled to a high level, the first pulse P_1 may be generated as an enable signal having a low level for a predetermined time. For example, the second pulse P_2 may not generated. That is, the second pulse P_2 may be fixed to the specific level. The over driving control signal OVD_ctrl may be enabled to a high level for an enabled section of the first pulse P_1.

Thus, when the selection signal Sel_s is enabled, the over driving control signal OVD_ctrl may have an enabled section substantially the same as the enabled section of the first pulse P_1.

Figure 4:
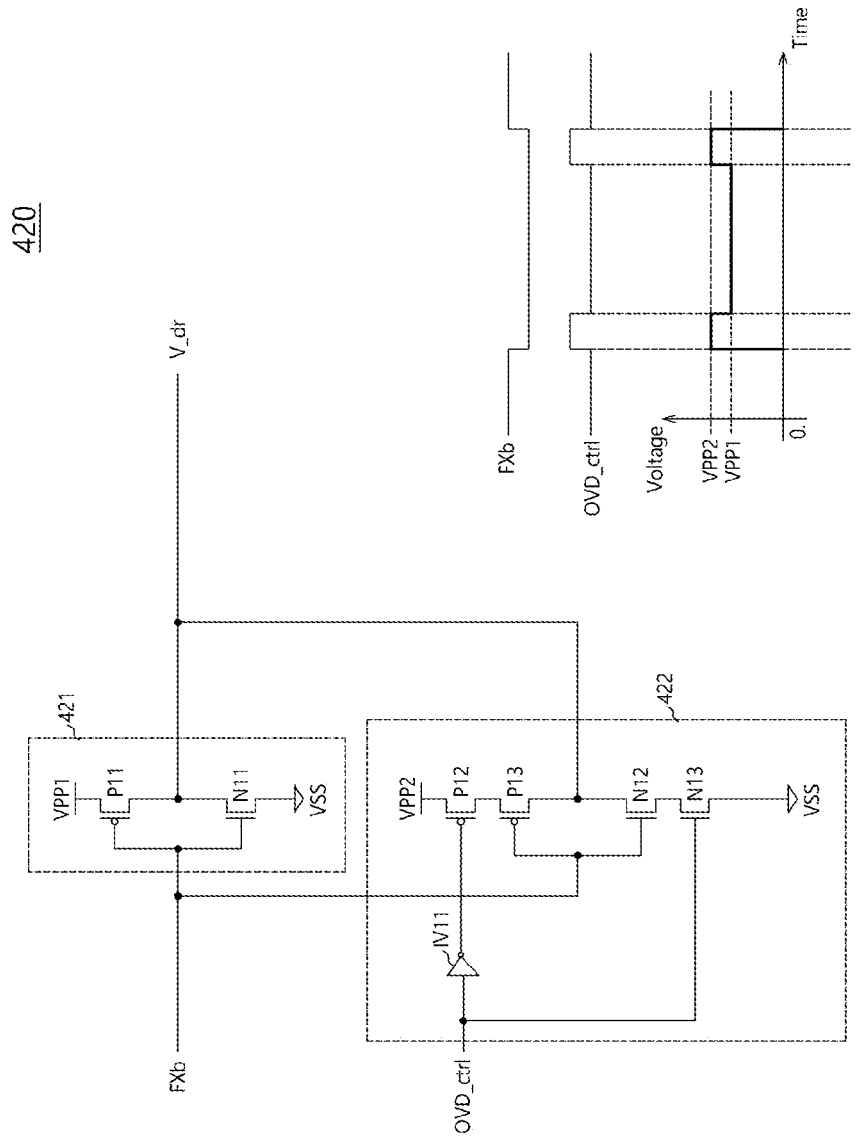
FIG. 4 is a circuit diagram illustrating a representation of an example of a driving voltage generator in FIG. 2.

FIG. 4 is a circuit diagram illustrating a representation of an example of a driving voltage generator in FIG. 2.

Referring to FIG. 4, the driving voltage-generator 420 may include a first voltage output 421 and a second voltage output 422.

The first voltage output 421 may output the first pumping voltage VPP1 as the driving voltage V_dr in response to the sub-word line selection signal FXb. For example, when the sub-word line selection signal FXb is enabled to a low level, the first voltage output 421 may output the first pumping voltage VPP1 as the driving voltage V_dr. For example, when the sub-word line selection signal FXb is enabled to a high level, the first voltage output 421 may output the ground voltage VSS as the driving voltage V_dr.

The first voltage output 421 may include a first transistor P11 and a second transistor N11. The sub-word line selection signal FXb may be inputted into a gate of the first transistor P11. The first pumping voltage VPP1 may be applied to a source of the first transistor P11. The sub-word line selection signal FXb may be inputted into a gate of the second transistor N11. A drain of the second transistor N11 may be electrically connected with a drain of the first transistor P11.

The ground voltage VSS may be applied to a source of the second transistor N11.

The second voltage output 422 may output the second pumping voltage VPP2 in an intersected section of an enabled section of the over driving control signal OVD_ctrl and an enabled section of the sub-word line selection signal FXb. For example, when the sub-word line selection signal FXb is enabled in the enabled section of the over driving control signal OVD_ctrl, the second voltage output 422 may output the second pumping voltage VPP2 as the driving voltage V_dr. For example, when the sub-word line selection signal FXb is disabled in the enabled section of the over driving control signal OVD_ctrl, the second voltage output 422 may output the ground voltage VSS as the driving voltage V_dr.

The second voltage output 422 may include a third transistor P12, a fourth transistor P13, a fifth transistor N12, a sixth transistor N13 and a first inverter IV11. The first inverter IV11 may receive the over driving control signal OVD_ctrl. An output signal from the first inverter IV11 may be inputted into a gate of the third transistor P12. The second pumping voltage VPP2 may be applied to a source of the third transistor P12. The sub-word line selection signal FXb may be inputted into a gate of the fourth transistor P13. A source of the fourth transistor P13 may be electrically connected with a drain of the third transistor P12. The sub-word line selection signal FXb may be inputted into a gate of the fifth transistor N12. A drain of the fifth transistor N12 may be electrically connected with a drain of the fourth transistor P13. The over driving control signal OVD_ctrl may be inputted into a gate of the sixth transistor N13. A drain of the sixth transistor N13 may be connected to a source of the fifth transistor N12. The ground voltage VSS may be applied to a source of the sixth transistor N13. An output terminal of the first voltage output 421 may be a node connected to the first and second transistors P11 and N11. An output terminal of the second voltage output 422 may be a node connected to the fourth and fifth transistors P13 and N12. The driving voltage V_dr may be outputted from a node commonly connected to the output terminals of the first and second voltage outputs 421 and 422.

The driving voltage generator 420 may output the second pumping voltage VPP2 as the driving voltage V_dr in the intersected section between the enabled sections of the sub-word line selection signal FXb and the over driving control signal OVD_ctrl. The driving voltage generator 420 may output the first pumping voltage VPP1 as the driving voltage V_dr in the intersected section between the disabled section of the over driving control signal OVD_ctrl and the enabled section of the sub-word line selection signal FXb. The driving voltage generator 420 may output the ground voltage VSS as the driving voltage V_dr in the disabled section of the sub-word line selection signal FXb and the over driving control signal OVD_ctrl.

Figure 5:
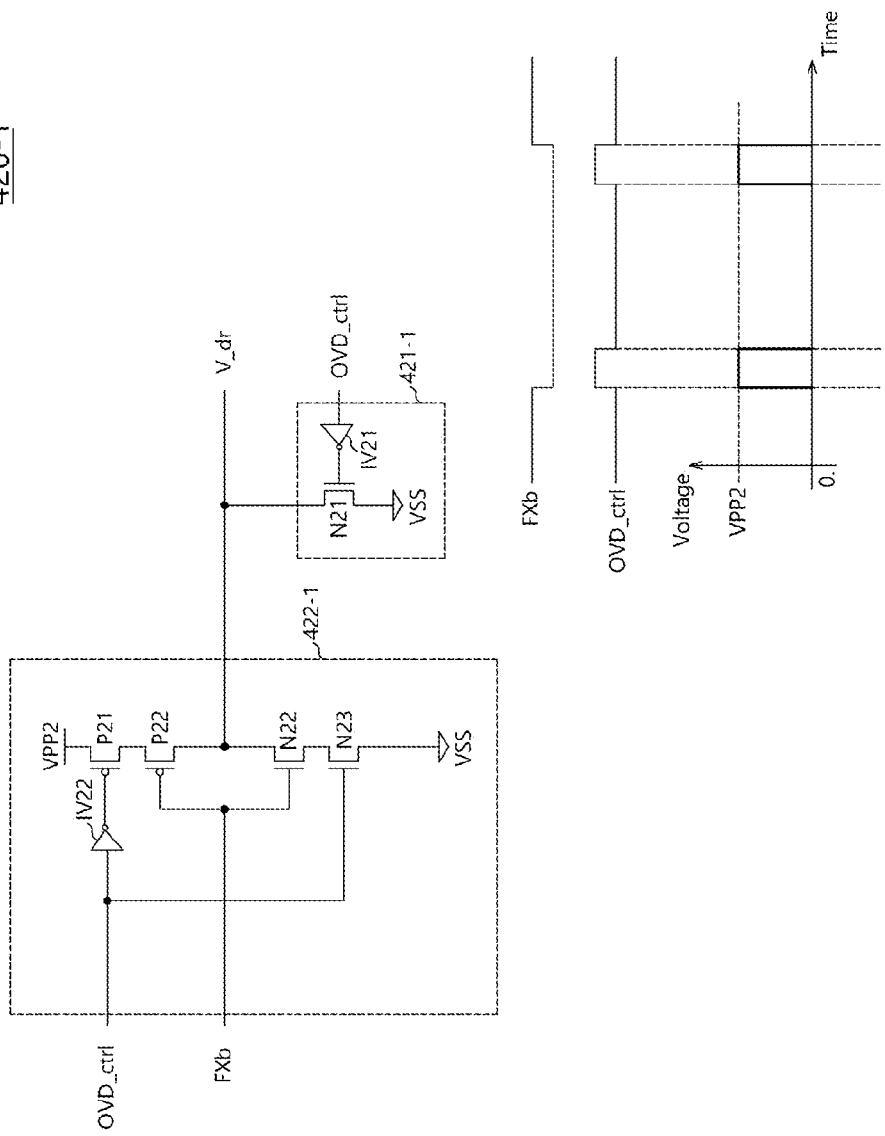
FIG. 5 is a circuit diagram illustrating a representation of an example of a driving voltage generator in FIG. 2.

FIG. 5 is a circuit diagram illustrating a representation of an example of a driving voltage generator in FIG. 2.

Referring to FIG. 5, a driving voltage generator 420-1 may include a first voltage applier 421-1 and a second voltage applier 422-1.

The first voltage applier 421-1 may output the ground voltage VSS as the driving voltage V_dr in response to the over driving control signal OVD_ctrl. For example, when the over driving control signal OVD_ctrl is disabled, the first voltage applier 421-1 may output the ground voltage VSS as the driving voltage V_dr.

The first voltage applier 421-1 may include a first inverter IV21 and a first transistor N21. The first inverter IV21 may receive the over driving control signal OVD_ctrl. An output signal from the first inverter IV21 may be inputted into a gate of the first transistor N21. A drain of the first transistor N21 may be connected to the output terminal of the driving voltage generator 420-1. The ground voltage VSS may be applied to a source of the first transistor N21. The driving voltage V_dr may be outputted from the output terminal of the driving voltage generator 420-1.

The second voltage applier 422-1 may output the second pumping voltage VPP2 as the driving voltage V_dr in response to the over driving control signal OVD_ctrl and the sub-word line selection signal FXb. For example, the second voltage applier 422-1 may output the second pumping voltage VPP2 as the driving voltage V_dr in an intersected section of an enabled section of the over driving control signal OVD_ctrl and an enabled section of the sub-word line selection signal FXb.

The second voltage applier 422-1 may include a second inverter IV22, a second transistor P21, a third transistor P22, a fourth transistor N22 and a fifth transistor N23. The second inverter IV22 may receive the over driving control signal OVD_ctrl. An output signal from the second inverter IV22 may be inputted into a gate of the second transistor P21. The second pumping voltage VPP2 may be applied to a source of the second transistor P21. The sub-word line selection signal FXb may be inputted into a gate of the third transistor P22. A source of the third transistor P22 may be electrically connected with a drain of the second transistor P21. The sub-word line selection signal FXb may be inputted into a gate of the fourth transistor N22. A drain of the fourth transistor N22 may be electrically connected with a drain of the third transistor P22. The over driving control signal OVD_ctrl may be inputted into a gate of the fifth transistor N23. A drain of the fifth transistor N23 may be connected to a source of the fourth transistor N22. The ground voltage VSS may be applied to a source of the fifth transistor N23.

The driving voltage generator 420-1 may output the ground voltage VSS as the driving voltage V_Dr in the disabled section of the over driving control signal OVD_ctrl. The driving voltage generator 420-1 may output the second pumping voltage VPP2 as the driving voltage V_dr in the intersected section between the enabled sections of the sub-word line selection signal FXb and the over driving control signal OVD_ctrl.

Operational differences between the driving voltage generator 420 in FIG. 4 and the driving voltage generator 420-1 in FIG. 5 may be as follows.

When the over driving control signal OVD_ctrl is disabled in the enabled section of the sub-word line selection signal FXb, the driving voltage generator 420 in FIG. 4 may output the first pumping voltage VPP1 as the driving voltage V_dr.

When the over driving control signal OVD_ctrl is disabled in the enabled section of the sub-word line selection signal FXb, the driving voltage generator 420-1 in FIG. 5 may output the ground voltage VSS as the driving voltage V_dr.

Operational equalities between the driving voltage generator 420 in FIG. 4 and the driving voltage generator 420-1 in FIG. 5 may be as follows.

The driving voltage generator 420 in FIG. 4 and the driving voltage generator 420-1 in FIG. 5 may output the second pumping voltage VPP2 as the driving voltage V_dr in the enabled sections of the sub-word line selection signal FXb and the driving control signal OVD_ctrl.

Figure 6:
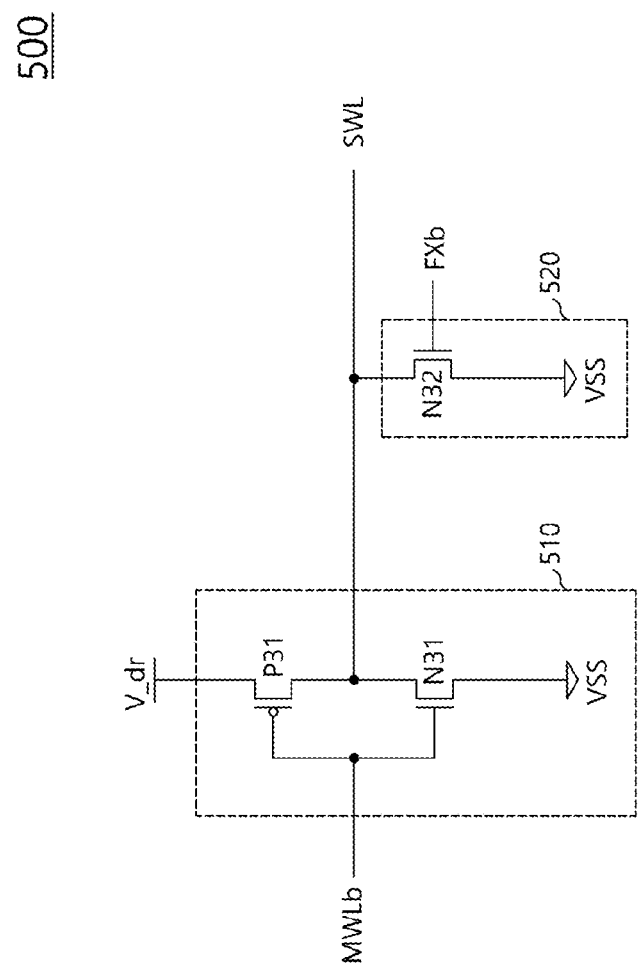
FIG. 6 is a circuit diagram illustrating a representation of an example of a word line-driving unit in FIG. 1.

FIG. 6 is a circuit diagram illustrating a representation of an example of a word line-driving unit in FIG. 1.

Referring to FIG. 6, the sub-word line driving unit 500 may include a first driver 510 and a second driver 520.

The first driver 510 may drive the sub-word line SWL using the driving voltage V_dr or the ground voltage VSS in response to the main word line MWLb. For example, when the main word line MWLb is activated to a low level, the first driver 510 may drive the sub-word line SWL using the voltage level of the driving voltage V_dr. When the main word line MWLb is activated to a high level, the first driver 510 may drive the sub-word line SWL using the voltage level of the ground voltage VSS.

The first driver 510 may include a first transistor P31 and a second transistor N31. The main word line MWLb may be connected to a gate of the first transistor P31. The driving voltage V_dr may be applied to a source of the first transistor P31. The main word line MWLb may be connected to a gate of the second transistor N31. A drain of the second transistor N31 may be connected to a drain of the first transistor P31. The ground voltage VSS may be applied to a source of the second transistor N31.

The second driver 520 may drive the sub-word line SWL using the voltage level of the ground voltage VSS in response to the sub-word line selection signal FXb. For example, when the sub-word line selection signal FXb is disabled to a high level, the second driver 520 may drive the sub-word line SWL using the voltage level of the ground voltage VSS.

The second driver 520 may include a third transistor N32. The sub-word line selection signal FXb may be connected to a gate of the third transistor N32. A drain of the third transistor N32 may be connected to an output terminal of the first driver 510. The ground voltage VSS may be applied to a source of the third transistor N32. The output terminals of the first and second drivers 510 and 520 may be commonly connected to a node. The common node may be connected to the sub-word line SWL.

The sub-word line-driving unit 500 may drive the sub-word line SWL in response to the main word line MWLb and the sub-word line selection signal FXb. For example, when the main word line MWLb is enabled, the sub-word line-driving unit 500 may drive the sub-word line SWL using the voltage level of the driving voltage V_dr. When the main word line MWLb or the sub-word line selection signal FXb is disabled, the sub-word line-driving unit 500 may drive the sub-word line SWL using the voltage level of the ground voltage VSS.

Hereinafter, examples of the operations of the semiconductor memory apparatuses will be discussed below.

Referring to FIG. 1, when the command CMD is the active command, the command-decoding unit 100 may enable the active signal ACT. When the command is the pre-charge command, the command-decoding unit 100 may disable the active signal ACT.

When the active signal ACT is enabled, the word line-enabling signal-generating unit 200 may enable the word line-enabling signal WLEN. When the active signal ACT is disabled, the word line-enabling signal-generating unit 200 may disable the word line-enabling signal WLEN.

The address-decoding unit 300 may decode the address ADD in the enabled section of the word line-enabling signal WLEN to generate the main word line MWLb and the sub-word line selection signal FXb.

The driving voltage-applying unit 400 may control the voltage level and the output time of the driving voltage V_dr in response to the active signal ACT, the word line-enabling signal WLEN and the sub-word line selection signal FXb.

Hereinafter, operations of the driving voltage-applying unit 400 are illustrated with reference to FIGS. 2 to 5.

The driving voltage-applying unit 400 may include the controller 410 and the driving voltage generator 420.

Referring to FIG. 3, the controller 410 may include the first pulse generator 411, the second pulse generator 412 and the pulse combiner 413.

The first pulse generator 411 may enable the first pulse P_1 when the word line-enabling signal WLEN is enabled.

When the selection signal Sel_s is disabled, the second pulse generator 412 may enable the second pulse P_2 when the active signal ACT is disabled. When the selection signal Sel_s is enabled, the second pulse generator 412 may fix the second pulse P_2 to a specific level regardless of the active signal ACT. In this example, the second pulse P_2 may have a disable voltage level.

The pulse combiner 413 may generate the over driving control signal OVD_ctrl having the enabled section substantially the same as the enabled section of the first and second pulse P_1 and P_2.

When the selection signal Sel_s is disabled, the controller 410 may enable the over driving control signal OVD_ctrl at the enable time of the word line-enabling signal WLEN and the enable time of the active signal ACT.

When the selection signal Sel_s is enabled, the controller 410 may enable the over driving control signal OVD_ctrl only at the enable time of the word line-enabling signal WLEN.

Thus, the controller 410 may determine whether the over driving control signal OVD_ctrl may be enabled once or twice in response to the selection signal Sel_s by one active operation.

Referring to FIG. 4, the driving voltage generator 420 may output the second pumping voltage VPP2 as the driving voltage V_dr in the enabled section of the sub-word line selection signal FXb and the over driving control signal OVD_ctrl. The driving voltage generator 420 may output the first pumping voltage VPP1 as the driving voltage V_dr in only the enabled section of the sub-word line selection signal FXb. The driving voltage generator 420 may output the ground voltage VSS as the driving voltage V_dr in the disabled section of the sub-word line selection signal FXb and the over driving control signal OVD_ctrl.

Referring to FIGS. 3 and 4, the address-decoding unit 300 may decode the address ADD in the enabled section of the word line-enabling signal WLEN to generate the main word line MWLb and the sub-word line selection signal FXb. Thus, the enabled section of the main word line MWLb and the sub-word line selection signal FXb may be substantially the same as the enabled section of the word line-enabling signal WLEN.

As a result, a first enabled section and a second enabled section of the over driving control signal OVD_ctrl may be overlapped with the enabled section of the sub-word line selection signal FXb.

Therefore, when the sub-word line selection signal FXb is enabled, the driving voltage generator 420 may output the second pumping voltage VPP2 as the driving voltage V_dr in the first enabled section of the over driving control signal OVD_ctrl. When the active signal ACT is disabled, the driving voltage generator 420 may output the second pumping voltage VPP2 as the driving voltage V_dr in the second enabled section of the over driving control signal OVD_ctrl. When the over driving control signal OVD_ctrl is disabled in the disabled section of the sub-word line section signal FXb, the driving voltage generator 420 may output the first pumping voltage VPP1 as the driving voltage V_dr in the disabled section between the first enabled section and the second enabled section of the over driving control signal OVD_ctrl. The driving voltage generator 420 may output the ground voltage VSS as the driving voltage V_dr in the disabled section of the over driving control signal OVD_ctrl and the sub-word line selection signal FXb.

Referring to FIG. 5, when the sub-word line selection signal FXb is enabled, the driving voltage generator 420-1 may output the second pumping voltage VPP2 as the driving voltage V_dr in the first enabled section of the over driving control signal OVD_ctrl. When the sub-word line selection signal FXb is enabled, the driving voltage generator 420-1 may output the ground voltage VSS as the driving voltage V_dr in the disabled section between the first enabled section and the second enabled section of the over driving control signal OVD_ctrl. The driving voltage generator 420-1 may output the ground voltage VSS as the driving voltage V_dr in the disabled section of the over driving control signal OVD_ctrl and the sub-word line selection signal FXb.

When the main word line MWLb is enabled, the sub-word line-driving unit 500 may drive the sub-word line SWL using the voltage level of the driving voltage V_dr. When any one of the main word line MWLb and the sub-word line selection signal FXb are disabled, the sub-word line-driving unit 500 may drive the sub-word line SWL using the voltage level of the ground voltage VSS.

The data by the voltage level of the sub-word line SWL in the memory cell 610 of the memory region 600 may be transmitted to the sense amplifier 700 through the bit line BL. The memory cell 610 may include the transistor N1 and the capacitor C1. When the voltage level of the sub-word line SWL is the voltage level of the first and second pumping voltages VPP1 and VPP2, the data in the capacitor C1 may be transmitted to the sense amplifier 700 through the bit line BL. When the voltage level of the sub-word line SWL is the voltage level of the ground voltage VSS, the capacitor C1 of the memory cell C1 may be separated from the bit line BL. Because the sub-word line SWL may be connected to the gate of the transistor N1, the data in the capacitor C1 may be transmitted to the bit line BL or the data in the bit line BL may be transmitted to the capacitor C1 without data loss in proportion to increasing of the voltage level of the sub-word line SWL.

The sense amplifier 70 may sense and amplify the data of the capacitor C1 transmitted to the bit line BL.

In the semiconductor memory apparatus, the over driving control signal OVD_ctrl may be enabled twice when the selection signal Sel_s is disabled. The over driving control signal OVD_ctrl may be enabled once when the selection signal Sel_s is enabled.

When the over driving control signal OVD_ctrl is twice enabled, the sub-word line SWL may be driven twice by the second pumping voltage VPP2. The two driving time points of the sub-word line SWL by the second pumping voltage VPP2 at one active operation may correspond to a time when the memory cell 610 may transmit the data to the bit line BL and a time when the data sensed and amplified by the sense amplifier 700 may be transmitted to the memory cell 610 through the bit line BL.

The data loss between the memory cell 610 and the bit line BL by the second pumping voltage VPP2 may be less than the data loss between the memory cell 610 and the bit line BL by the first pumping voltage VPP1, because the second pumping voltage VPP2 may be higher than the first pumping voltage VPP1.

The driving voltage generator 420 in FIG. 4 may drive the sub-word line SWL by the second pumping voltage VPP2, the first pumping voltage VPP1 and the second pumping voltage VPP2 in order. Thus, a time for providing the sub-word line SWL with the voltage level of the secondary second pumping voltage VPP2 may be reduced so that the semiconductor memory apparatus may have a rapid operational speed.

The driving voltage generator 420-1 in FIG. 5 may drive the sub-word line SWL by the second pumping voltage VPP2, the ground voltage VSS and the second pumping voltage VPP2 in order. Thus, the sub-word line SWL may be driven by the second pumping voltage VPP2 only when the data is transmitted between the memory cell 610 and the bit line BL so that semiconductor memory apparatus may have relatively lower power consumption.

Figure 7:
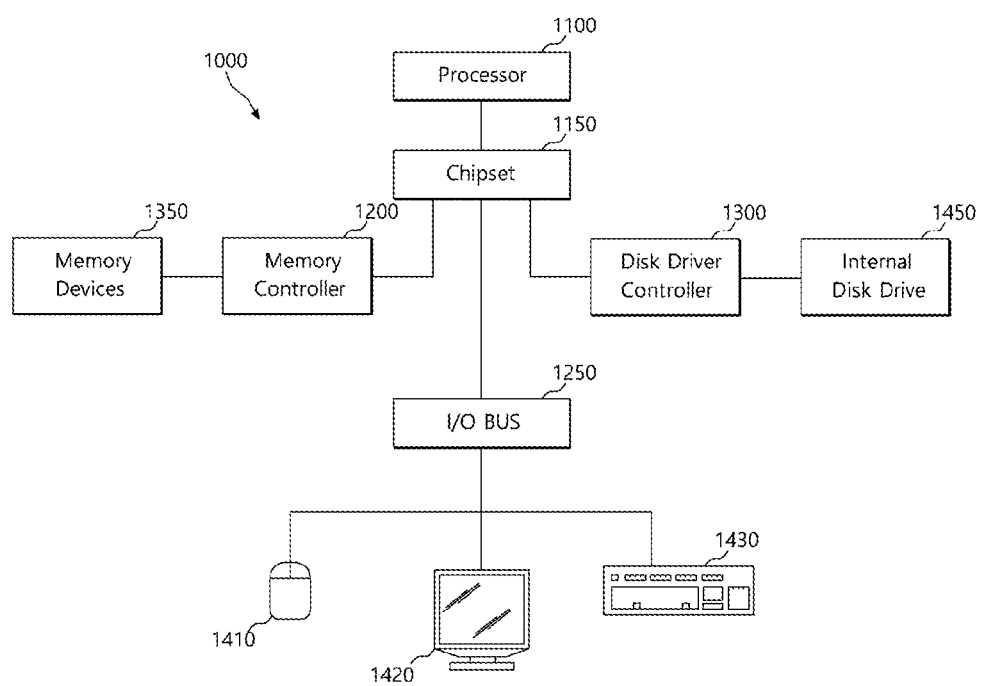
FIG. 7 illustrates a block diagram of an example of a representation of a system employing a semiconductor memory apparatus in accordance with the various embodiments discussed above with relation to FIGS. 1-6.

The semiconductor memory apparatus discussed above (see FIGS. 1-6) are particular useful in the design of memory devices, processors, and computer systems. For example, referring to FIG. 7, a block diagram of a system employing a semiconductor memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor memory apparatus as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs").

Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor memory apparatus as discussed above with relation to FIGS. 1-6. In alternate embodiments, such as, for example but not limited to, cellular phones or digital cameras, the components may differ from the embodiments illustrated in FIG. 7.

While various embodiments have been described above, it will be understood to those skilled in the art that the embodiments described are by way of example only. Accordingly, the circuit and method described herein should not be limited based on the described embodiments.

What is claimed is:

1. A semiconductor memory apparatus comprising:
   a driving voltage-applying unit configured to generate a driving voltage in response to an active signal, a word line-enabling signal and a sub-word line selection signal; and
   a sub-word line-driving unit configured to drive a sub-word line by a voltage level of the driving voltage in response to a main word line and the sub-word line selection signal.

2. The semiconductor memory apparatus of claim 1, wherein the driving voltage-applying unit outputs a second pumping voltage higher than a first pumping voltage as the driving voltage when the word line-enabling signal is enabled and the active signal is disabled while the sub-word line selection signal is enabled.

3. The semiconductor memory apparatus of claim 2, wherein the driving voltage-applying unit outputs the first pumping voltage as the driving voltage when the sub-word line selection signal is enabled, except when the driving voltage has the second pumping voltage.

4. The semiconductor memory apparatus of claim 2, wherein the driving voltage-applying unit outputs a ground voltage as the driving voltage when the sub-word line selection signal is enabled, except when the driving voltage has the second pumping voltage.

5. The semiconductor memory apparatus of claim 3, wherein the driving voltage-applying unit comprises:

a controller for generating an over driving control signal in response to the word line-enabling signal and the active signal; and
   a driving voltage generator for outputting any one of the first pumping voltage and the second pumping voltage as the driving voltage in response to the over driving voltage control signal and the sub-word line selection signal.

6. The semiconductor memory apparatus of claim 5, wherein the controller generates the over driving control signal enabled when the word line-enabling signal is enabled and the active signal is disabled.

7. The semiconductor memory apparatus of claim 6, wherein the controller comprises:
   a first pulse generator for generating a first pulse, the first pulse enabled when the word line-enabling signal is enabled;
   a second pulse generator for generating a second pulse, the second pulse enabled when the active signal is disabled; and
   a pulse combiner for outputting the first and second pulses as the over driving control signal.

8. The semiconductor memory apparatus of claim 5, wherein the driving voltage generator outputs the second pumping voltage as the driving voltage when the over driving control signal is enabled and when the sub-word line selection signal is enabled, and the first pumping voltage as the driving voltage when the over driving control signal is disabled and when the sub-word line selection signal is enabled.

9. The semiconductor memory apparatus of claim 4, wherein the driving voltage-applying unit comprises:
   a controller for generating an over driving control signal in response to the word line-enabling signal and the active signal; and
   a driving voltage generator for outputting any one of the second pumping voltage and the ground voltage as the driving voltage in response to the over driving voltage control signal and the sub-word line selection signal.

10. The semiconductor memory apparatus of claim 9, wherein the controller generates the over driving control signal enabled when the word line-enabling signal is enabled and the active signal is disabled.

11. The semiconductor memory apparatus of claim 10, wherein the driving voltage generator outputs the second pumping voltage as the driving voltage when the over driving control signal is enabled and when the sub-word line selection signal is enabled, and the ground voltage as the driving voltage when the over driving control signal is disabled and when the sub-word line selection signal is enabled.

12. A semiconductor memory apparatus comprising:
   a command-decoding unit configured to generate an active signal in response to a command;
   a word line-enabling signal-generating unit configured to generate a word line-enabling signal in response to the active signal;
   an address-decoding unit configured to decode an address when the word line-enabling signal is enabled to generate a main word line and a sub-word line selection signal;
   a driving voltage-applying unit configured to generate a driving voltage in response to the active signal, the word line-enabling signal and the sub-word line selection signal;

a sub-word line-driving unit configured to drive a sub-word line by a voltage level of the driving voltage in response to the main word line and the sub-word line selection signal;

a memory region configured to reciprocally transmit data to a bit line in response to the sub-word line selection signal; and a sense amplifier configured to sense and amplify the data in the bit line.

13. The semiconductor memory apparatus of claim 12, wherein the command-decoding unit enables the active signal when the command includes an active command, and the command-decoding unit disables the active signal when the command includes a pre-charge command.

14. The semiconductor memory apparatus of claim 13, wherein the driving voltage-applying unit outputs a second pumping voltage, which is higher than a first pumping voltage, as the driving voltage when the word line-enabling signal is enabled, and the driving voltage-applying unit outputs the second pumping voltage as the driving voltage when the active signal is disabled.

15. The semiconductor memory apparatus of claim 14, wherein the sub-word line-driving unit drives the sub-word line by the second pumping voltage when the second pumping voltage as the driving voltage is applied to the sub-word line-driving unit.

16. The semiconductor memory apparatus of claim 15, wherein the memory region transmits/receives the data to/from the bit line when the sub-word line is driven by the second pumping voltage.

17. A semiconductor memory apparatus comprising:
a sub-word line-driving unit configured to drive a sub-word line by a voltage level of a driving voltage when a main word line and a sub-word line selection signal are enabled; and a driving voltage-applying unit configured to output a second pumping voltage higher than a first pumping voltage as the driving voltage for a predetermined time when a word line-enabling signal is enabled, outputs the second pumping voltage as the driving voltage for the predetermined time when an active signal is disabled, and outputs the first pumping voltage as the driving voltage when both the word line-enabling signal and the active signal are enabled.

18. The semiconductor memory apparatus of claim 17, wherein the driving voltage-applying unit generates a first pulse when the word line-enabling signal is enabled, a second pulse when the active signal is disabled, and the second pumping voltage as the driving voltage when the first and second pulses are enabled.

19. The semiconductor memory apparatus of claim 18, wherein the driving voltage-applying unit comprises:
a controller for generating an over driving control signal in response to the word line-enabling signal and the active signal; and a driving voltage generator for outputting the driving voltage in response to the over driving voltage control signal.

20. A semiconductor memory apparatus comprising:
a driving voltage-applying unit configured to generate either a first pumping voltage, a second pumping voltage, or ground voltage as a driving voltage; and a sub-word line-driving unit configured to drive a sub-word line by a voltage level of the driving voltage in response to a main word line and a sub-word line selection signal.

21. The semiconductor memory apparatus of claim 20, wherein the driving voltage-applying unit generates the second pumping voltage, then the first pumping voltage, and then the second pumping voltage, in order, to allow the sub-word line-driving unit to drive the sub-word line by the second pumping voltage before the first pumping voltage, then drive the sub-word line by the first pumping voltage, and then drive the sub-word line again with the second pumping voltage after the sub-word line is driven by the first pumping voltage.

22. The semiconductor memory apparatus of claim 21, further comprising:
a memory cell coupled to the sub-word line and a bit line, wherein the sub-word line is driven by the second pumping voltage only when data is transmitted between the memory cell and the bit line.

23. The semiconductor memory apparatus of claim 22, wherein the second pumping voltage is greater than the first pumping voltage, and the first pumping voltage is greater than the ground voltage.

24. The semiconductor memory apparatus of claim 22, wherein the driving voltage-applying unit generates the second pumping voltage, then the ground voltage, and then the second pumping voltage, in order, to allow the sub-word line-driving unit to drive the sub-word line by the second pumping voltage before the ground voltage, then drive the sub-word line by the ground voltage, and then drive the sub-word line again with the second pumping voltage after the sub-word line is driven by the ground voltage.

25. The semiconductor memory apparatus of claim 20, wherein the driving voltage-applying unit configured to generate the driving voltage in response to an active signal, a word line-enabling signal and a sub-word line selection signal.

* * * * *